United States Patent [19]
Shultz

[11] Patent Number: 6,077,026
[45] Date of Patent: Jun. 20, 2000

[54] PROGRAMMABLE SUBSTRATE SUPPORT FOR A SUBSTRATE POSITIONING SYSTEM

[75] Inventor: Richard E. Shultz, Austin, Tex.

[73] Assignee: Progressive System Technologies, Inc., Austin, Tex.

[21] Appl. No.: 09/050,321

[22] Filed: Mar. 30, 1998

[51] Int. Cl.[7] .................................................. B25J 15/06
[52] U.S. Cl. ..................... 414/744.1; 901/40; 414/937; 294/64.1
[58] Field of Search .................................. 294/86.4, 902; 414/744.5, 736, 935, 937, 941; 901/40

[56] References Cited

U.S. PATENT DOCUMENTS

| | | | |
|---|---|---|---|
| 4,449,885 | 5/1984 | Hertel et al. .............................. | 414/750 |
| 4,971,512 | 11/1990 | Lee et al. .............................. | 414/744.8 |

FOREIGN PATENT DOCUMENTS

| | | | |
|---|---|---|---|
| 609105 | 8/1994 | European Pat. Off. ................ | 414/937 |
| 04346247 | 2/1992 | Japan . | |
| 82625 | 4/1993 | Japan ..................................... | 414/937 |
| 07201957 | 4/1995 | Japan . | |

Primary Examiner—Gregory A. Morse
Attorney, Agent, or Firm—Fliesler, Dubb, Meyer & Lovejoy LLP

[57] ABSTRACT

A programmable substrate support including a first substrate support that mates with a second substrate support to enable automatic switching between different types of substrates. The first substrate support is configured to support a first type of substrate and to mount to a substrate positioning system to enable handling of substrates of the first type. The second substrate support is configured to support a second type of substrate, and is further configured to mate with the first substrate support to form a mated configuration. The mated configuration enables the substrate positioning system to handle substrates of the second type. In a semiconductor wafer processing embodiment, the first substrate support is an end effector capable of handling wafers of a first size, such as 200 millimeter (mm) wafers, and the second substrate support is another end effector capable of handling wafers of a second size, such as 300 mm wafers. Of course, any size and type of substrate is contemplated. The first and second end effectors include complementary couplers that enables the second end effector to mount on top of the first end effector in the mated configuration. The complementary couplers may further include locating features to enable repeatable alignment between the end effectors.

17 Claims, 12 Drawing Sheets

PROGRAMMABLE SUBSTRATE SUPPORT FOR A SUBSTRATE POSITIONING SYSTEM

FIELD OF THE INVENTION

The current invention relates generally to the field of handling equipment for substrates, and more particularly to programmable substrate supports for a substrate positioning system that enable automated material handling apparatus to handle different types of substrates without human intervention.

DESCRIPTION OF THE RELATED ART

Substrates, such as semiconductor wafers or the like, are typically transported between, and processed by, one or more automatic processing stations. Semiconductor wafers, for example, are typically processed in a substantially clean environment. Semiconductor wafers are generally flat, circular plates made of semiconducting material. The semiconductor chip industry is currently transitioning to a new size semiconductor wafer. The previous standard wafer size of 200 mm diameter is being gradually replaced with a new standard wafer size of 300 mm. During the transition period, substrate manufacturers must be capable of handling both 200 mm and 300 mm wafers. Under the previous standard of 200 mm, chip manufacturers generally allowed the wafer handling equipment to touch the underside of 200 mm wafers. However, for ultra clean environment handling of the new 300 mm wafers, contact of the underside of the wafer with handling equipment is undesirable, and contact with handling equipment is preferably limited to the wafer edge. For example, current SEMI spec permits touching the underside of a wafer only within 3 mm of the rim of the wafer.

Substrate handling devices are generally equipped with an end effector for holding and transporting substrates among the various processing stations. An end effector is a generally flat implement for securely holding a substrate. An end effector is typically configured to hold a particular size of substrate. Therefore, different sizes of substrates generally require different sizes of end effectors. Manual replacement of a first end effector with a second end effector, and vice versa, requires skilled labor and can be time consuming, resulting in higher costs and production delays. Thus, what is needed is a programmable substrate support for a substrate positioning system for automatically changing substrate handling equipment according to substrate type.

SUMMARY OF THE INVENTION

A programmable substrate support according to the present invention includes a first substrate support that mates with a second substrate support to enable a substrate positioning system to automatically switch between handling different types of substrates. The first substrate support is configured to support a first type of substrate and to mount to a substrate positioning system to enable the substrate positioning system to handle substrates of the first type. The second substrate support is configured to support a second type of substrate and to mate with the first substrate support to form a mated configuration to enable the substrate positioning system to handle substrates of the second type. In this manner, the first substrate support is used to process substrates of the first type and the second substrate support is mated with the first substrate support in the mated configuration to process substrates of the second type.

The first and second substrate supports may include complementary couplers that engage each other when the second substrate support is joined with the first substrate support. The complementary couplers may further include locating features that align the first and second substrate supports with each other when joined. The locating features may be configured to enable repeatable alignment when the first and second substrate supports are joined. Preferably, the complementary couplers mate with zero insertion force. In one embodiment, the complementary couplers include a positioning pin provided on the first substrate support and a corresponding slot provided on the second substrate support. The slot includes sides slanted towards a center to guide the positioning pin to the center when the first and second substrate supports are joined.

A retention mechanism may be used to secure the second substrate support to the first substrate support in the mated configuration. In this manner, the first and second substrate supports are securely fastened to each other to enable faster processing. For example, the retention mechanism may include vacuum apparatus to apply a vacuum to secure the second substrate support to the first substrate support. Other retention mechanisms are contemplated, such as electromagnetic couplers, air cylinder couplers, etc.

The first substrate support may further include a first vacuum pad area that engages and grips a substrate of the first type when a vacuum is applied. The second substrate support may include a vacuum port that communicatively engages the first vacuum pad area in the mated configuration so that the second vacuum port engages and grips a substrate of the second type when a vacuum is applied. For semiconductor wafer processing in a clean mode of operation, the vacuum ports may be used to grip substrates to enable faster processing. For semiconductor wafer processing in an ultra clean mode of operation, however, vacuum grip is not used if it generates more particulate. Instead, each substrate is gripped only at the edges. Gripping each substrate only at the edges ensures less particulate generation, although processing occurs at a slower rate.

In a more specific embodiment, the first substrate support is an end effector that supports a semiconductor wafer having a diameter of approximately 200 millimeters. Similarly, the second substrate support is an end effector that supports a semiconductor wafer having a diameter of approximately 300 millimeters. In this manner, the first end effector is used to process 200 mm wafers and the second end effector is used in the mated configuration to process 300 mm wafers.

A substrate positioning system according to the present invention includes a robot with a moveable arm, where the first substrate support is mounted to the moveable arm to enable the robot to handle substrates of the first type. The second substrate support is configured to mate with the first substrate support to enable the robot to handle substrates of the second type. In one embodiment, the robot positions the first substrate support below the second substrate support and then raises the first substrate support to join the first and second substrate supports together to form the mated configuration. Preferably, a nest is included to support the second substrate support when not being used, where the robot retrieves the second substrate support from the nest to process substrates of the second type.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE INVENTION

Figure 1:
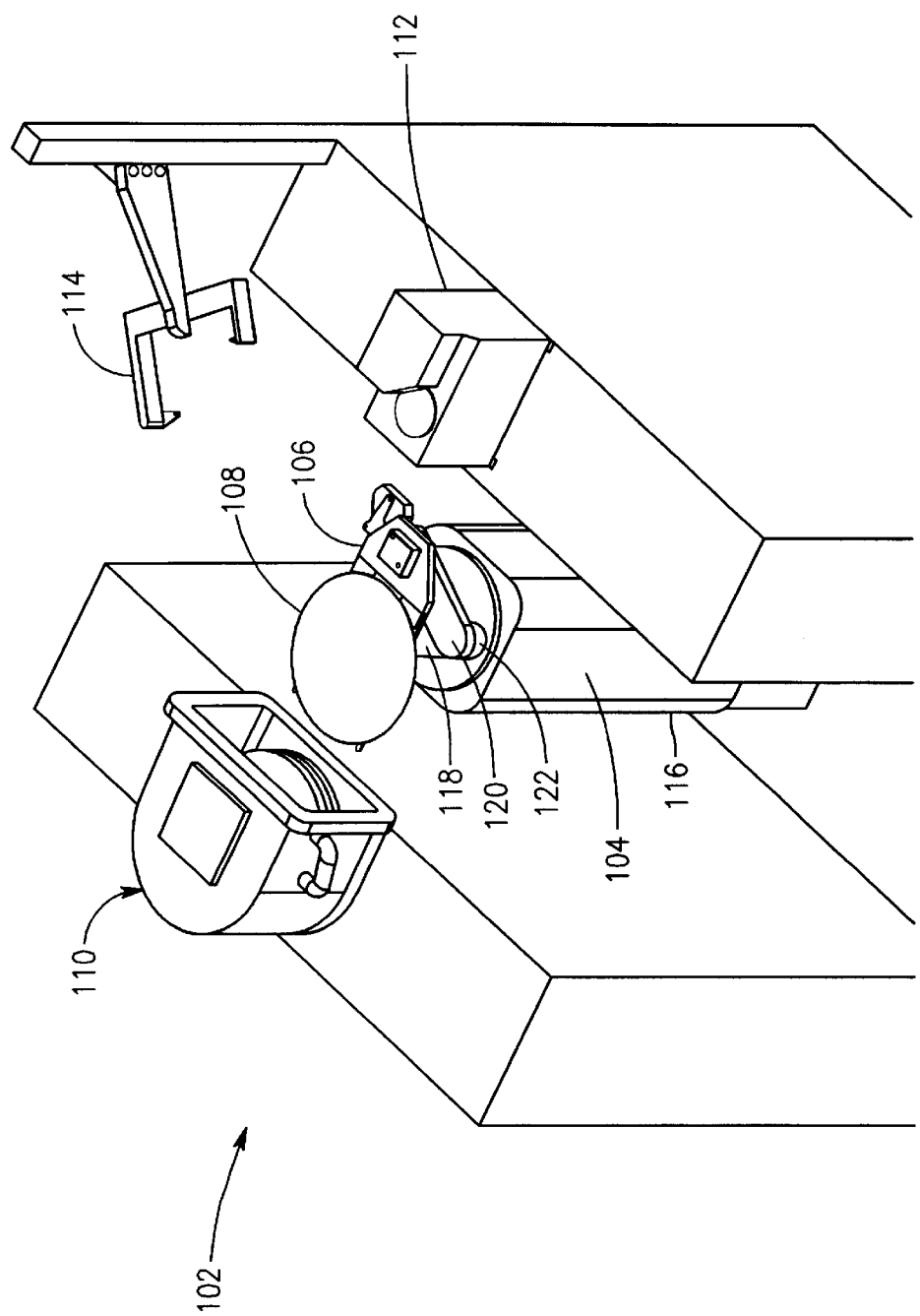
FIG. 1 is a perspective view of a substrate handling device.
Figure 2:
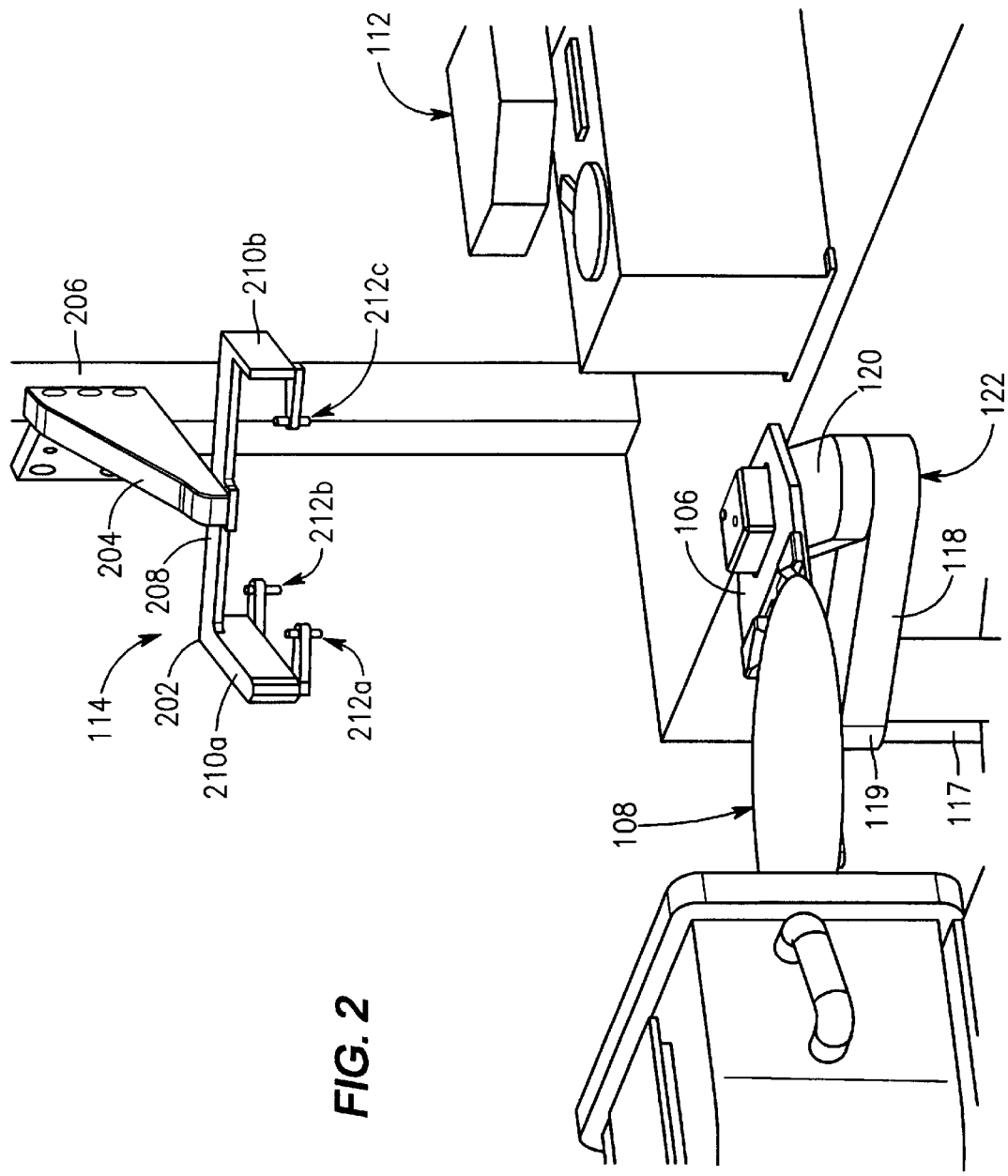
FIG. 2 is another perspective view of the substrate handling device showing more detail of a nest for storing an end effector.

Referring now to FIG. 1, a perspective view is shown of a substrate positioning system 102 implemented according to the present invention. The substrate positioning system 102 includes a robot 104 having an end effector 106 configured to hold a substrate 108 and to transport the substrate 108 between at least one pod 110 having multiple slots for supporting substrates and at least one substrate processing device 112. The substrate processing device 112 is illustrated as a prealigner, but other devices may be included in addition to the prealigner 112 substituted therefor, which perform any of a number of processing operations on the substrate, including, by way of example, inspection, sorting, and stepper functions. Also shown is a nest 114 for storing the end effector 106 when the end effector 106 is not in use. The robot 104 includes an elongated base 116 out of which projects an extendable and rotatable shaft 117 (FIG. 2). Attached to a rotatable shoulder 119 on top of the shaft 117 is a lower link 118 connected to an upper link 120 by a pivotable elbow 122. The end effector 106 is mounted to a wrist (not shown) on top of the upper link 120 such that the end effector 106 grips or supports a substrate 108, allowing the robot 104 to transport the substrate 108 from a pod 110 to a substrate processing device 112 via extension or retraction and rotation of the shaft 117 and/or rotation of the upper link 120 with respect to the lower link 118. The upper link 120 pivots on the elbow 122 such that the end effector may orthogonally approach any of the pod 110, the substrate processing device 112, and the nest 114.

Examples of substrates include semiconductor wafers, flat panel displays, masks, microchip modules, etc. The present invention is illustrated with semiconductor wafer handling equipment. It is noted, however, that the present invention is not limited to semiconductor wafers, but is applicable to any type of substrate, such as substrates formed of glass, aluminum, Mylar®, etc. Furthermore, the present invention may be applied to printed wiring boards such as sheets of FR-4 or 1060 material or other fiberglass material, etc. In the embodiment shown, the substrates are circular semiconductor wafers, having a diameter of 200 mm or 300 mm and a thickness of 0.031 inches. However, the substrates may have any shape, such as square or rectangular and may have any desired thickness. The present invention is not limited to any particular type, shape, size or thickness of the substrates.

The semiconductor industry trend is toward larger semiconductor substrates. Up until now, one standard size semiconductor substrate wafer measured 200 mm in diameter. The semiconductor industry is transitioning, however, to a new standard semiconductor substrate size of 300 mm in diameter. A new size of substrate requires a new size of substrate handling equipment, because substrate handling equipment must be capable of securely and precisely handling each substrate. Furthermore, it has been considered acceptable up until now for the substrate handling equipment to contact the substrate surface. However, new standards are being developed under which contact between the substrate surface and the substrate handling equipment is preferably limited to the edge of the substrate only. For example, current SEMI standards permit underside wafer touching for 300 mm semiconductor wafers within 3 mm of the edge of the wafer.

FIG. 2 is a more detailed perspective view of the substrate handling device 102 which more particularly shows the nest 114. The nest 114 consists of an open bracket 202 held by a coupling 204. The coupling 204 is clamped to a vertical shaft 206. The open bracket 202 is preferably rectangular in shape, with a back portion 208 for connection to the coupling 204 and first and second parallel arms 210a and 210b, positioned on either end, respectively, of the back portion 208. Attached to the bottom edge of either end of the first arm 210a are locator pins 212a and 212b. Attached to the bottom edge of the end of the first arm 210b opposite the back portion 208 is a locator pin 212c. The locator pins 212a, 212b, and 212c serve to locate and support the end effector 106 when it is not in use.

To effect storage of the end effector 106, the robot shaft 117 extends upward until the end effector 106 is positioned parallel to and slightly above the locator pins 212a, 212b, and 212c of the nest 114. Next, the shaft 117 pivots to align the end effector 106 with the nest 114. The locator pins 212a, 212b, and 212c align to corresponding locator pin mates not shown on the end effector 106 and the robot shaft 117 retracts to lower the end effector 106 such that the locator pins 212a, 212b, and 212c engage the locator pin mates of the end effector 106. In this manner, the end effector 106 is securely supported by the locator pins 212a, 212b, and 212c of the nest 114. For example, locator pin mates 606a and 606c (FIG. 6) are located on an end effector 502.

Through similar motions of extension or retraction and rotation of the shaft 117 and pivoting of the elbow 122, the robot 104, with an end effector 106 attached to the upper link 120, retrieves a substrate 108 from a pod 110 and moves the substrate 108 to or from a substrate processing device 112, in which certain operations are performed on the substrate 108. For all of the above listed substrate handling operations, the end effector 106 acts as a support device for holding the substrate 108 during precise positioning operations.

Figure 3:
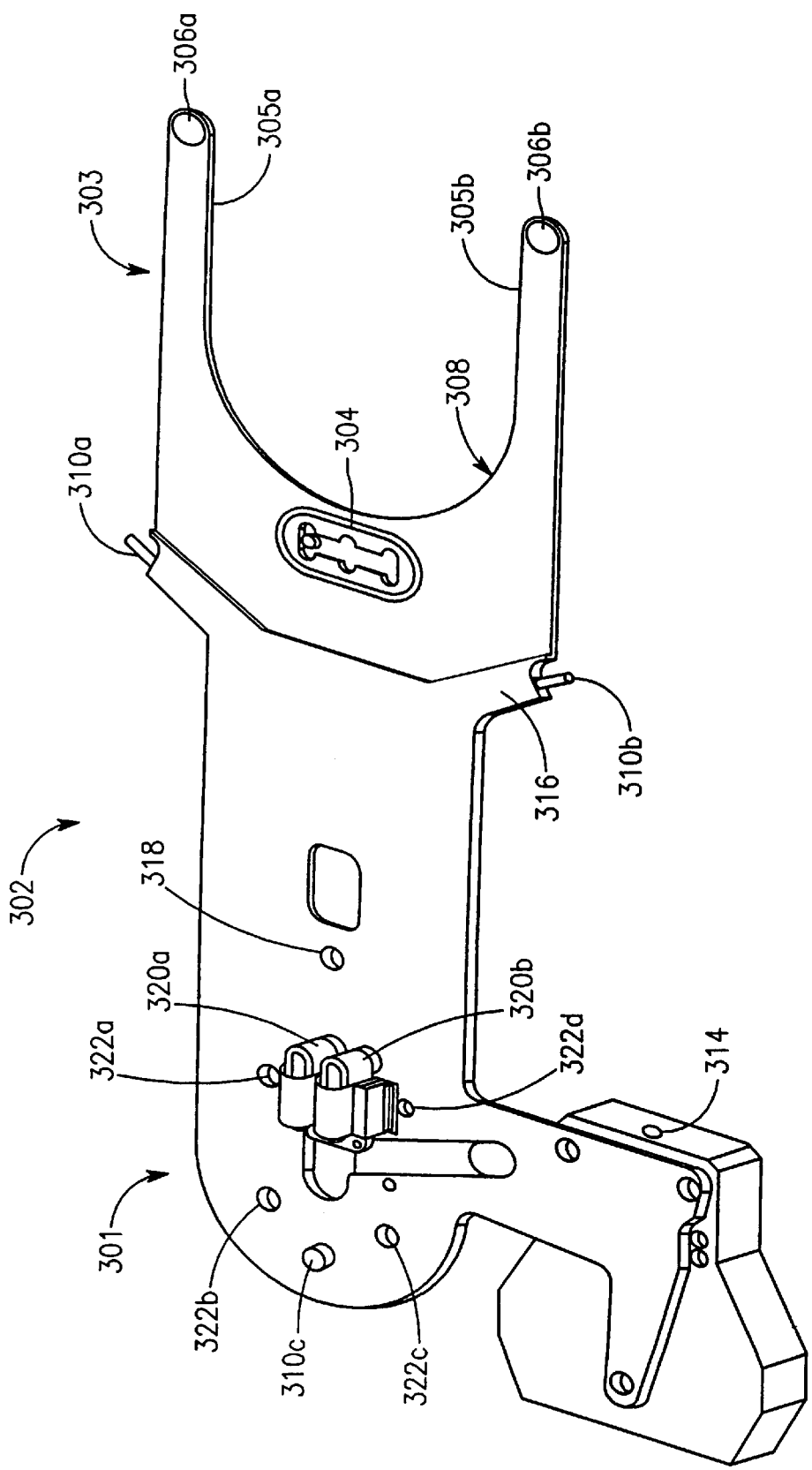
FIG. 3 shows a first end effector that is used with the substrate handling device of FIG. 1.

Referring to FIG. 3, a first end effector 302 is shown. The first end effector 302 is a substantially flat broad-bladed implement that is specialized for supporting substrate of a first type. In particular, the first end effector 302 is configured to support a 200 mm semiconductor wafer from the bottom side of the wafer during wafer processing. However, the first end effector 302 is not limited to use with 200 mm semiconductor wafers, and may be proportioned to hold and/or transport other substrates and other substrate sizes. The first end effector 302 comprises an L-shaped handle portion 301, one end of which terminates in a paddle-shaped substrate-holding portion 303 characterized by a U-shaped cutout. The U-shaped cutout 308 is proportioned such that the first end effector 302 is able to place a substrate on a chuck (not shown) that may be located on process and/or aligning equipment (not shown). Each of the resulting arms 305a and 305b forming the outer boundary of the U-shaped cutout 308 of the substrate-holding area 303 have at their ends buttons 306a and 306b, respectively, for contacting the substrate surface. As mentioned previously, it is desired to minimize contact between substrate handling equipment and a substrate so as to reduce the probability of contamination of the substrate with particulate matter from the substrate handling equipment. Therefore, the plastic buttons 306a and 306b are raised slightly from the surface of the holding area 303 of the first end effector 302 such that the area of contact between the substrate-holding area 303 of the first end effector 302 and the substrate is minimized.

Located on the top surface of the substrate-holding area 303 is a vacuum pad area 304, which creates suction for gripping a substrate (not shown) to the substrate-holding area 303 of the first end effector 302. The vacuum pad area 304 is coupled to a vacuum line 320a to create the vacuum. Contact between the substrate and the first end effector 302 is limited to the vacuum pad area 304 and the plastic buttons 306a and 306b. Located on the top surface of the handle portion 301 of the first end effector 302 is a vacuum port 318. The vacuum port 318 provides suction for gripping a second end effector 502 (FIG. 5) when the second end effector 502 is engaged with the first end effector 302. The vacuum port 318 connects to a vacuum line 320b separate from the vacuum line 320a for the vacuum pad area 304. It is noted, however, that use of a vacuum seal between the first end effector 302 and the second end effector 502 is not the only means of securing the second end effector 502 to the first end effector 302. For example, an electromagnet could be used, or, alternatively, a mechanical latch engaged by a positive air pressure cylinder could be used.

The first end effector 302 is mounted to the robot wrist (not shown) on the upper link 120 (shown in FIGS. 1 and 2). Preferably, the first end effector 302 is fixedly mounted to the upper link 120 with bolts (not shown) connected through bolt holes 322a, 322b, 322c, and 322d, but, alternatively, the first end effector 302 could be removably mounted to the upper link 120. The first end effector 302 contains a laser 314 for determining which pod slots contain wafers. The laser 314 scans the height of the pod 110 (shown in FIG. 1) to determine which pod slots contain wafers. The first end effector 302 has three couplers 310a, 310b, and 310c for coupling to the second end effector 502, as will be described below. The first and second couplers 310a and 310b comprise pins which extend out from either end of a lip 316 which abuts the wafer holding area 303 of the first end effector 302. The third coupler 310c is a peg which extends upward from the top surface of the handle portion 301 of the first end effector 302. The couplers 310a, 310b, and 310c act to anchor the second end effector 502 in place atop the first end effector 302 when the second end effector 502 is in use. The first end effector 302 may be used either alone or in conjunction with the second end effector 502, depending upon the size of the substrate to be supported and the mode of operation. Operation may take place in one of several modes, for example, operation may take place in a clean environment or in an ultra clean environment.

The first end effector 302 is preferably made of aluminum, and the plastic buttons 306a and 306b comprise a thermoplastic, such as polyetheretherketone (PEEK) or the like. Of course, any material having sufficient chemical, abrasion, and mechanical properties for interfacing the substrate 108 may be used.

Figure 4:
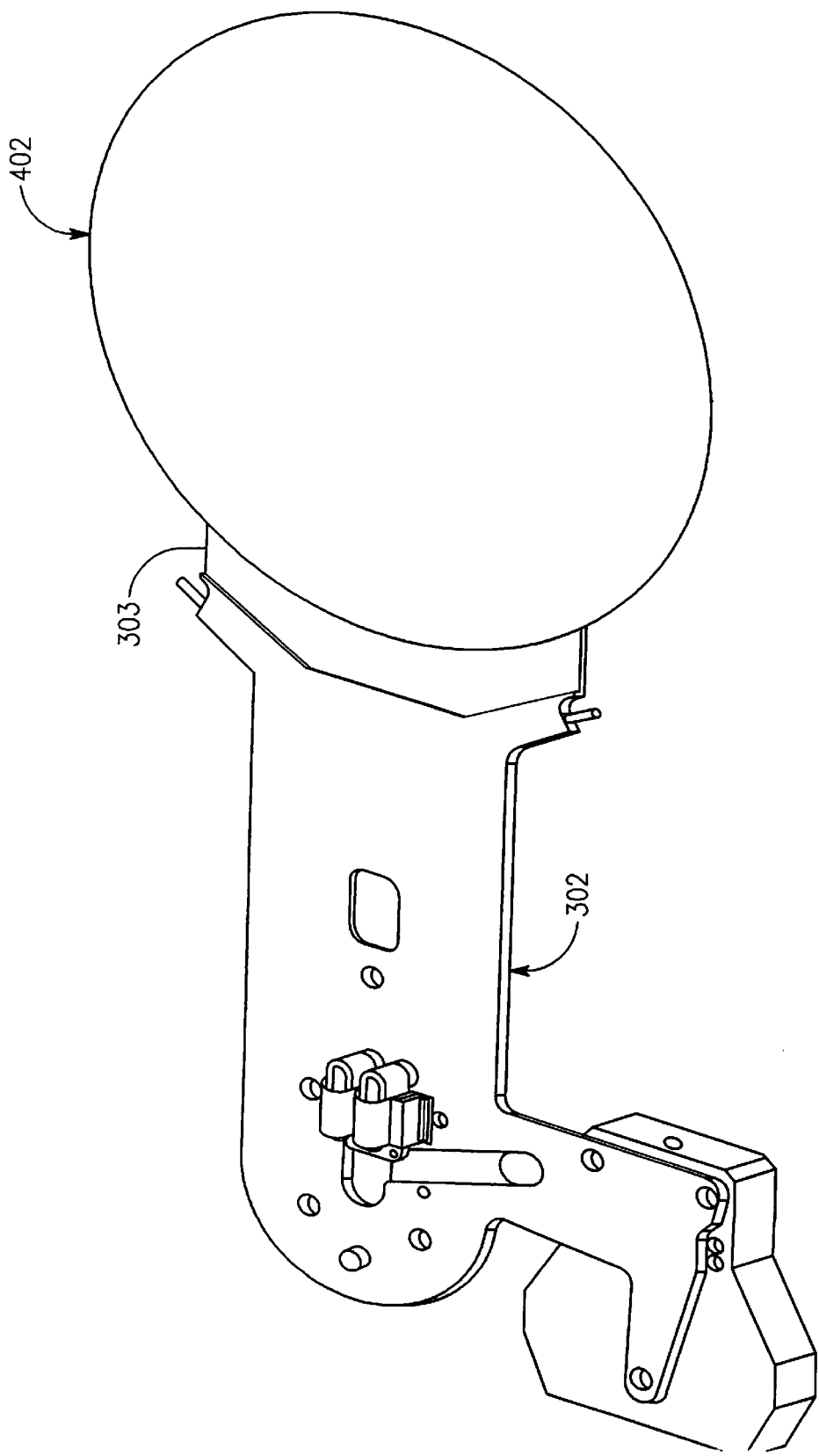
FIG. 4 shows the first end effector holding a 200 mm semiconductor wafer.

FIG. 4 shows a first end effector 302 holding a 200 mm wafer 402 atop the wafer holding area 303 (in shadow) of the first end effector 302.

Figure 5:
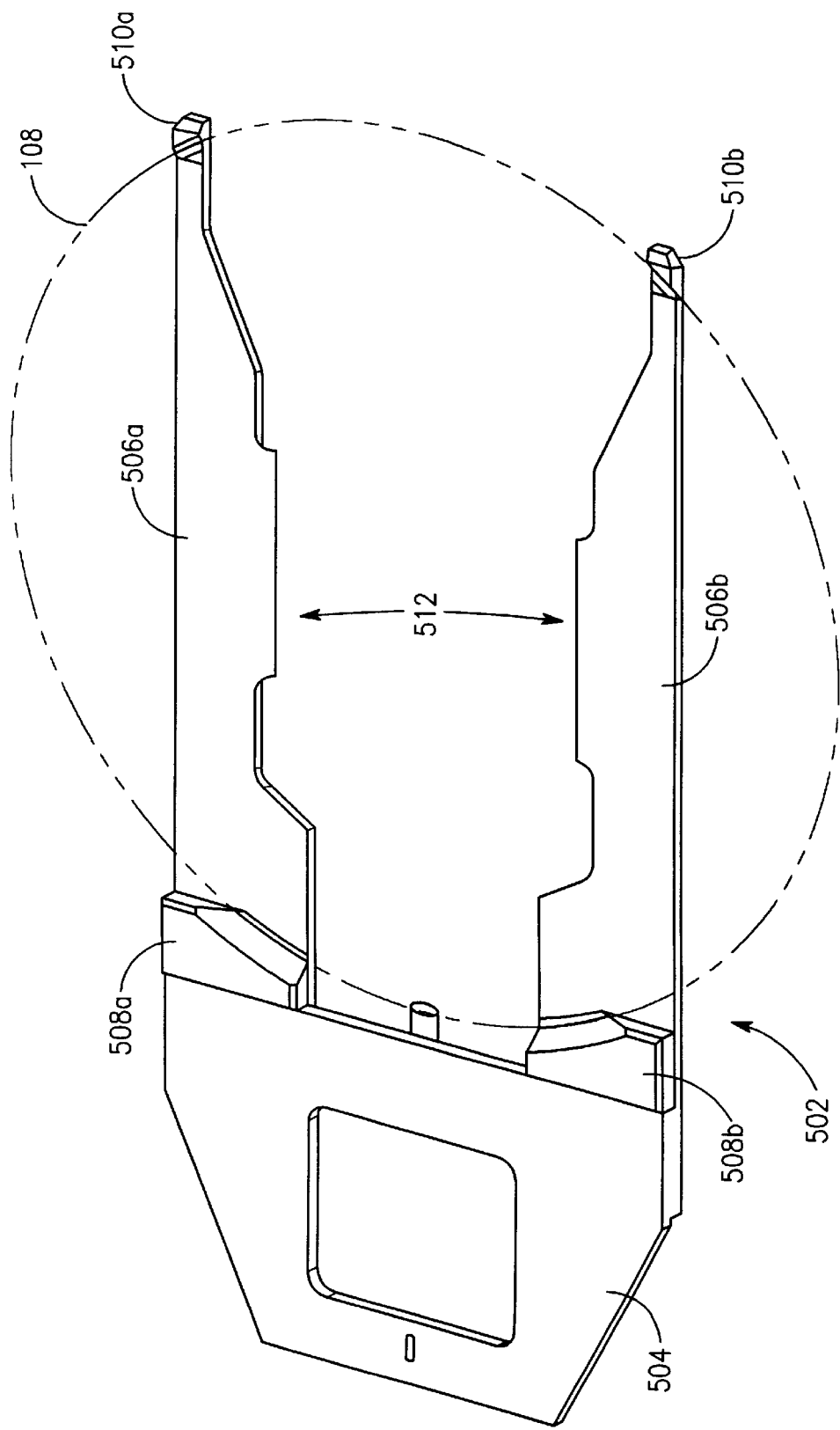
FIG. 5 shows the top side of a second end effector configured to engage the first end effector for handling larger substrates.

FIG. 5 shows the top of the second end effector 502 for holding and transporting a second type substrate, such as a 300 mm semiconductor wafer 108. In a similar manner as the first end effector 302, the second end effector 502 comprises a substantially rectangular flat plate portion 504 and two parallel fingers 506a and 506b. The two fingers 506a and 506b are substantially flat members which extend outward from and perpendicular to one side of the plate portion 504. Each of the fingers 506a and 506b (collectively, 506) comprises a substantially flat member having a curved shelf 508a and 508b (collectively, 508) at the end of the finger 506 abutting the plate portion 504 and an edge grip pad 510 at the opposite end of the finger 506. The fingers 506a and 506b form a substrate-supporting structure 512 of the second end effector 502. By use of the edge grip pads 510a and 510b and the shelves 508a and 508b, a substrate (shown in shadow) may be held in place atop the substrate-supporting structure 512 of the second end effector 502. Bottom contact between the substrate and the second end effector 502 is limited to an area within 3 mm from the edge of the substrate, because the curved shelves 508a and 508b and the edge grip pads 510a and 510b only touch the edge of the substrate. Current SEMI standards permit underside wafer touching for 300 mm semiconductor wafers within 3 mm of the edge of the wafer. Therefore, the present invention conforms with current SEMI standards.

Figure 6:
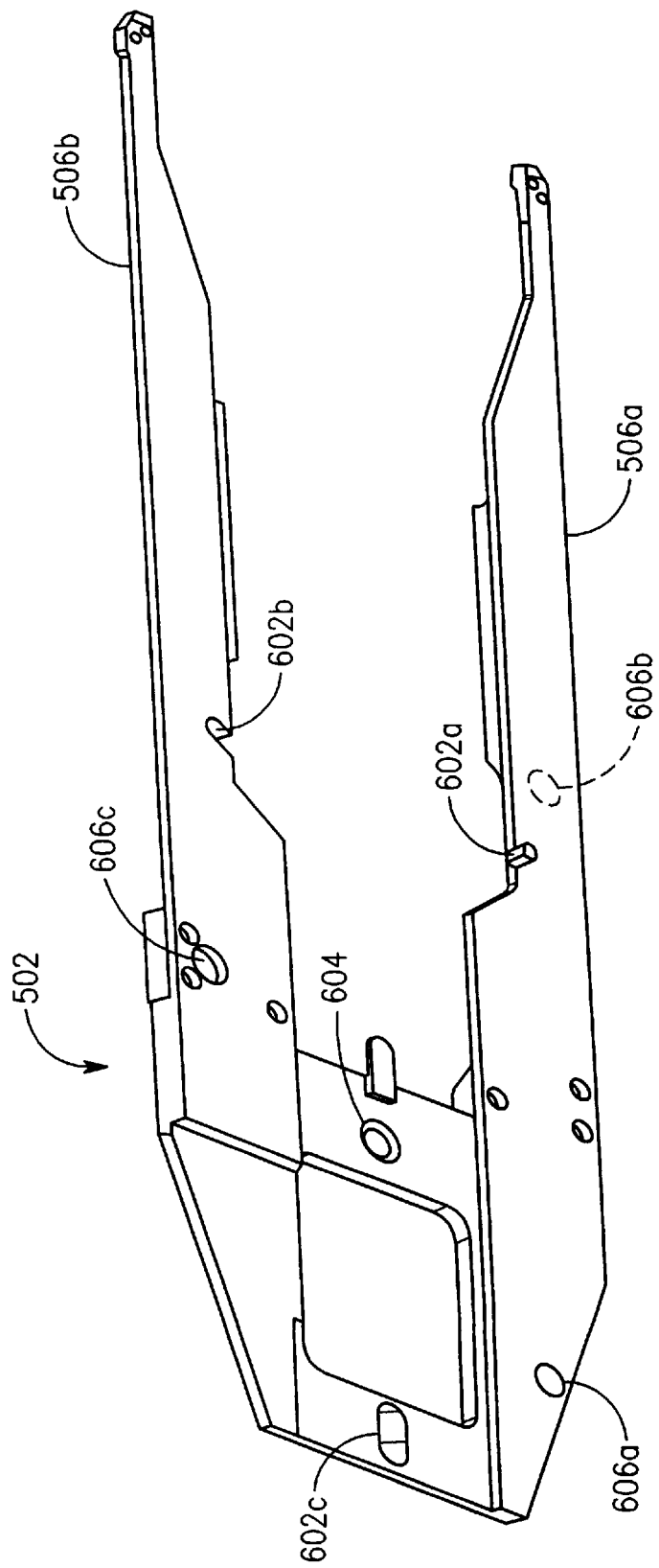
FIG. 6 shows the underside of the second end effector.

FIG. 6 shows the underside of the second end effector 502, illustrating the features which enable it to couple with the first end effector 302. For example, the underside of the second end effector 502 has complementary couplers 602a, 602b, and 602c which engage with or mate to the couplers 310a, 310b, and 310c of the first end effector 302 shown in FIG. 3. The first and second complementary couplers 602a and 602b include locating features, which are slanted notches cut into the underside of the first finger 506a and second finger 506b, respectively, of the second end effector 502. The first and second locating features 602a and 602b are proportioned and positioned to receive the 310a and 310b of the first end effector 302. The slant of the notches guides the pins of the corresponding couplers 310a and 310b so that the pins are positioned the same within the notches each time. The third complementary coupler 602c includes a locating feature, which is a bore having slanted side walls cut out of the underside of the plate portion 504 of the second end effector 502, and which is proportioned and positioned to receive the third locating feature 310c of the first end effector 302. As with the first and second complementary couplers 602a and 602b, the third complementary coupler 602c guides the peg of the third coupler 310c so that the peg is positioned the same within the bore each time.

When the complementary couplers 602a, 602b, and 602c engage the couplers 310a, 310b, and 310c, the mating process requires zero insertion force, as the complementary couplers 602a, 602b, and 602c simply rest atop the couplers 310a, 310b, and 310c of the first end effector 302. Further, due the complementary design of the matching complementary couplers 602a, 602b, and 602c and the complementary couplers 310a, 310b, and 310c, the engagement process provides secure coupling and repeatable positioning of the second end effector 502 with respect to the first end effector 302.

Also shown in FIG. 6 are first and second locator pin mates 606a and 606c, respectively. The locator pin mates 606a and 606c engage the locator pins 212a, and 212c of the nest 114 (shown in FIG. 2) when the robot 104 returns the second end effector 502 to the nest 114. Reference locator 606c is also shown. Reference locator 606c references the location of locator pin 212b when the robot 104 returns the second end effector 502 to the next 114. Locator pin mates 606a and 606c comprise shallow cylindrical bores cut into the underside of the fingers 506a and 506b, respectively, of the second end effector 502. Locator pin mates 606a and 606c are proportioned and positioned to receive locator pins 212a and 212c of the nest 114.

FIG. 6 also shows a vacuum cup 604 located on the underside of the plate portion 504 of the second end effector 502 for coupling to the vacuum port 318 of the first end effector 302 (shown in FIG. 4). The vacuum port 318 of the first end effector 302 provides the suction necessary to securely temporarily attach the second end effector 502 to the first end effector 302. The vacuum cup 604 is proportioned and positioned to flexibly receive the vacuum port 318. It is preferable that the vacuum cup 604 loosely fit the vacuum port 318 such that air can flow between the vacuum cup 604 and vacuum port 318. In this way the vacuum can more effectively seal the vacuum cup 604 to the vacuum port 318.

Figure 7:
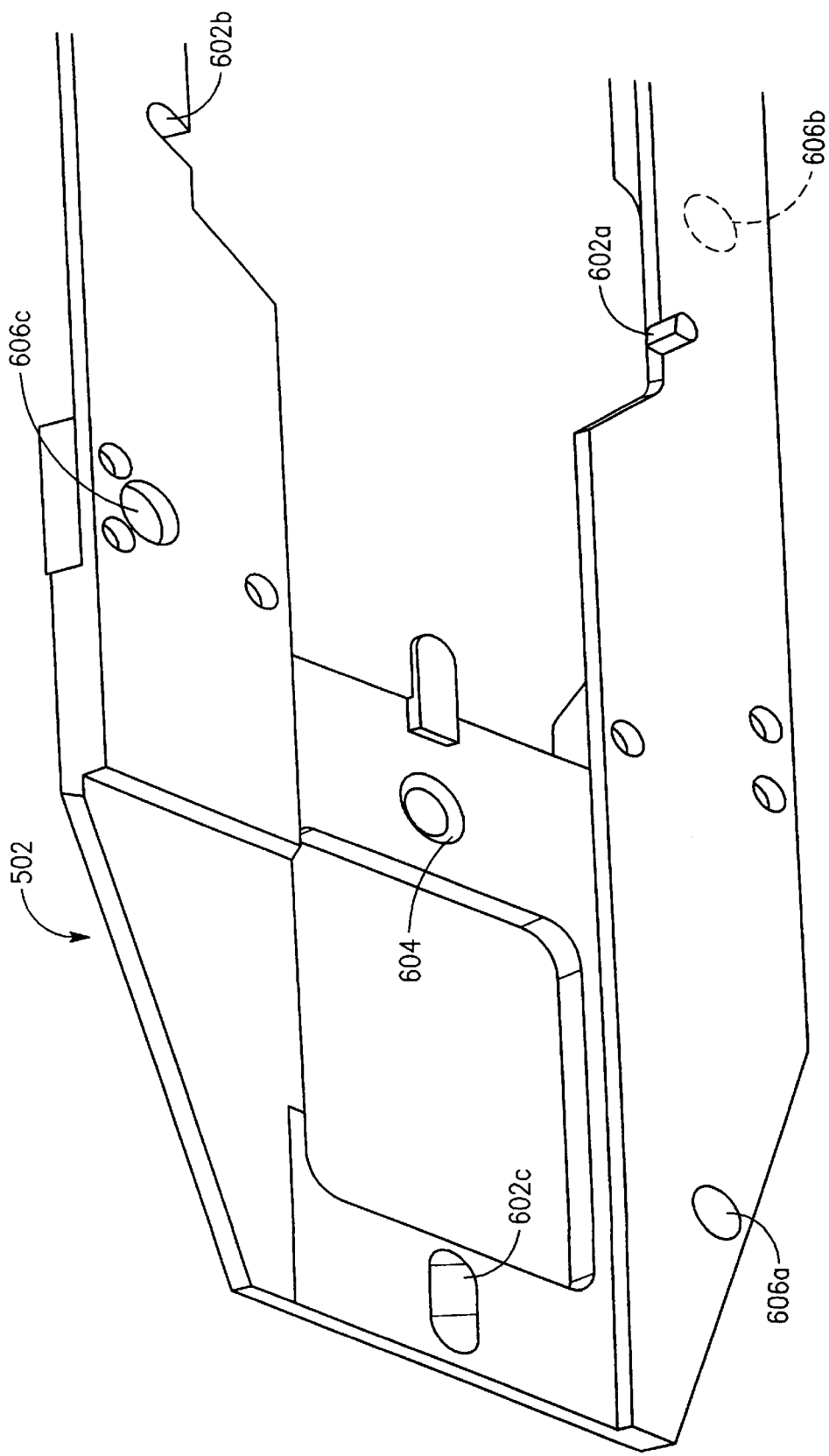
FIG. 7 shows an enlarged view of the underside of the second end effector, illustrating locating and holding features of the second end effector.

FIG. 7 shows an enlarged view of the underside of the second end effector 502 and more particularly illustrates the slant of the side walls and notches of the matching locating features 602a and 602c.

Figure 8:
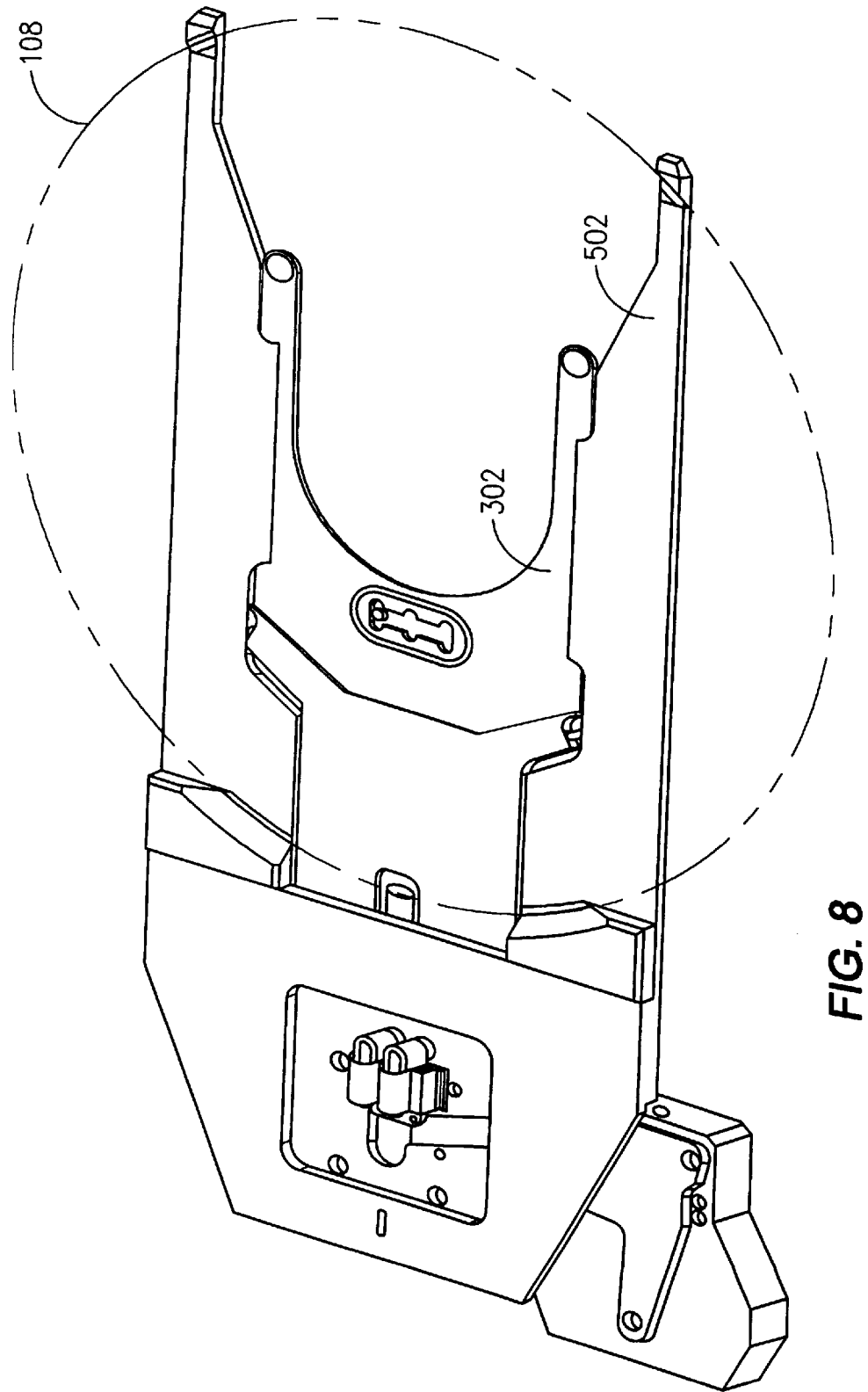
FIG. 8 depicts the second end effector which has been engaged with the top side of a first end effector.

Referring now to FIG. 8, the underside of the second end effector 502 is shown engaged with the top side of a first end effector 302 to form a mated configuration. In this configuration, the first end effector 302 supports the second end effector 502 atop the robot wrist (not shown). The substrate 108 is shown in shadow atop the coupled end effectors 502 and 302. The first end effector 302 does not contact the substrate 108. Thus, the second end effector 502 is positioned on top of the first end effector 302 which is mounted to the robot wrist, so that only the second end effector 502 performs holding and transferring operations with larger substrates, such as the substrate 108.

Figure 9:
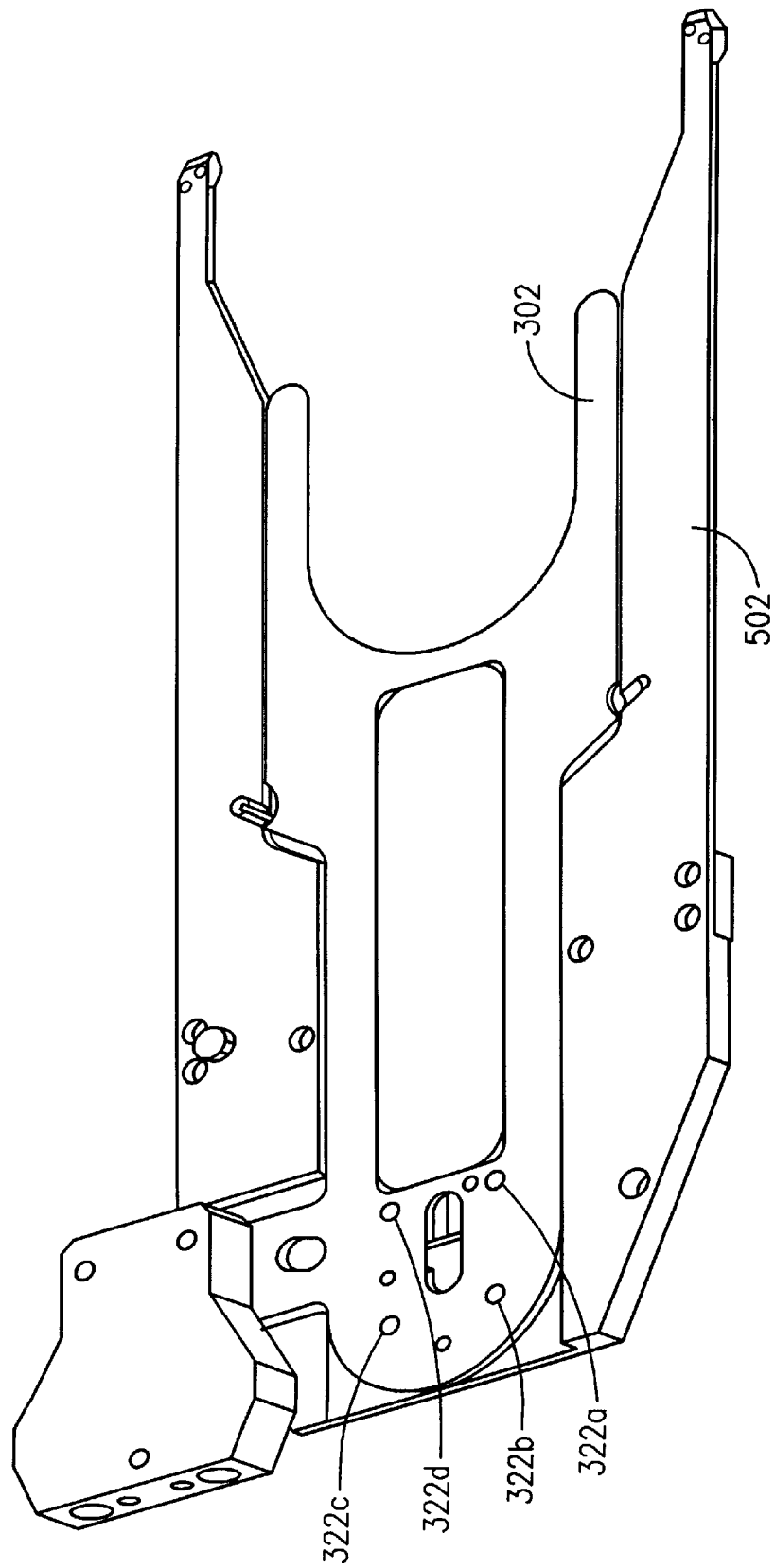
FIG. 9 shows the underside of the coupled configuration of the second end effector and the first end effector.

FIG. 9 shows the underside of the mated configuration of the first end effector 302 and the second end effector 502. Bolt holes 322a, 322b, 322c and 322d in the first end effector 302 are provided for securing the first end effector 302 to the robot wrist. The bolt holes 322a, 322b, 322c and 322d (collectively, 322) comprise cylindrical bores cut into the handle portion 301 of the first end effector 302. The bolt holes 322 are proportioned and positioned to couple to matching bolt holes on the top side of the robot wrist (not shown).

Figure 10:
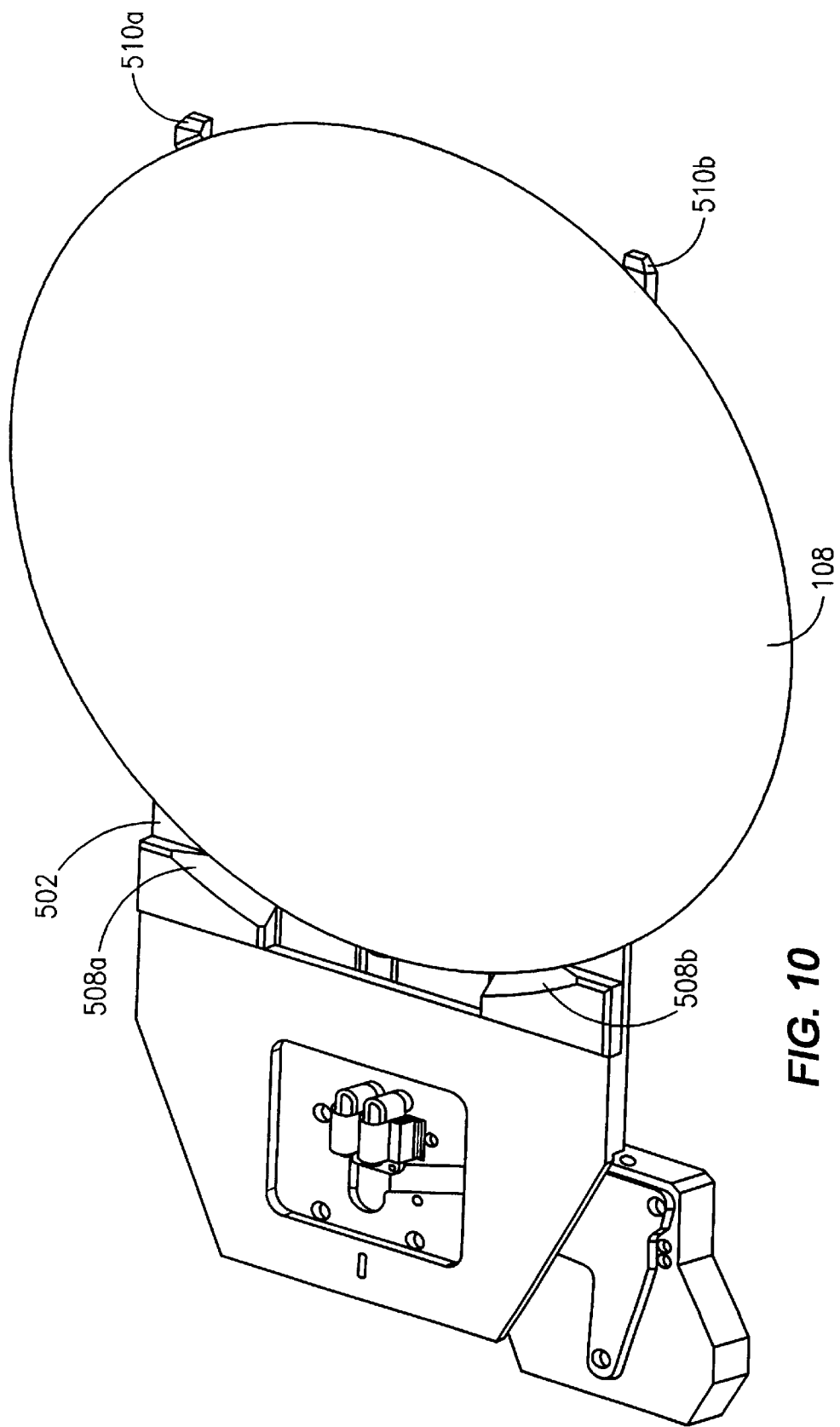
FIG. 10 depicts the second end effector holding a 300 mm semiconductor wafer.

FIG. 10 depicts the substrate 108 being supported the edge grip pads 504 of the second end effector 502.

Figure 11A:
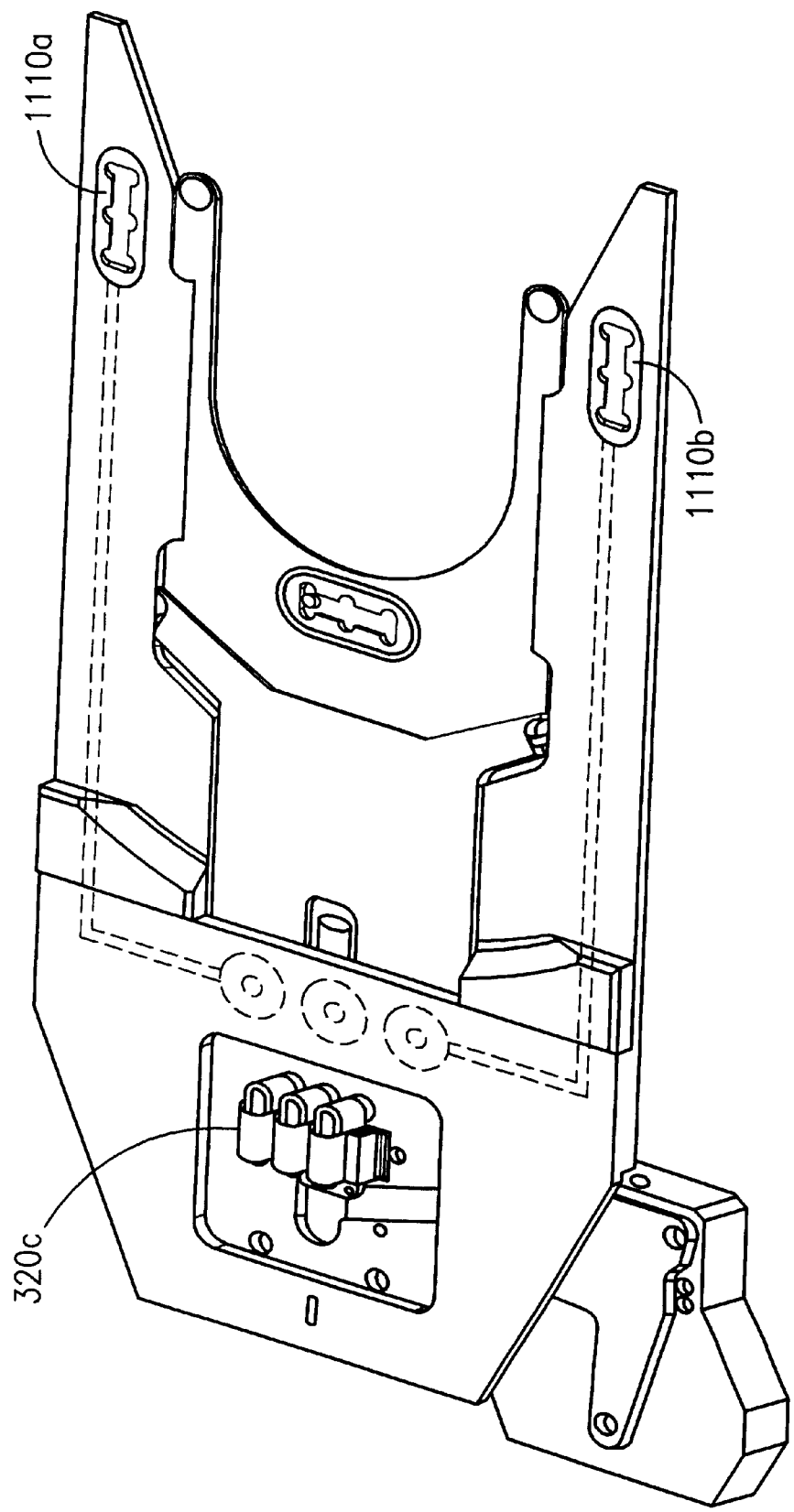
FIG. 11a shows the second end effector adapted to grip a substrate using a vacuum pads.

Referring now to FIG. 11, under less stringent operating conditions, the second end effector 502 is equipped with vacuum pads 110a and 110b located on the top surface of each arm 506a and 506b, respectively, which create suction for gripping a substrate (not shown) to the substrate-holding area 512 of the second end effector 502. The vacuum pads 1110a and 1110b are coupled to a third vacuum line 320c to create the vacuum.

Figure 11B:
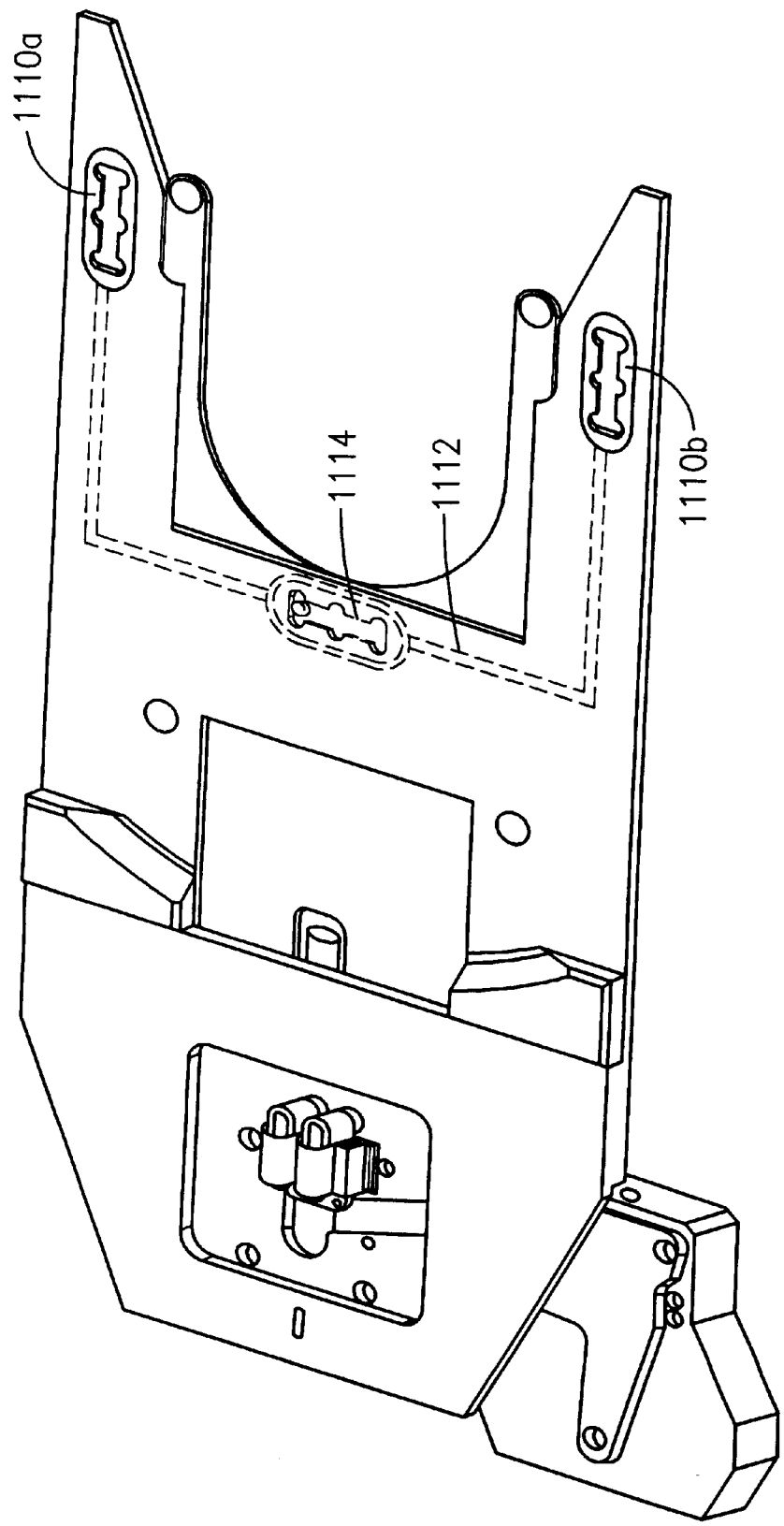
FIG. 11b shows the second end effector adapted to grip a substrate using vacuum pads which are communicatively connected to the vacuum pad area of the first end effector.

Lastly, referring to FIG. 11b, an alternative embodiment is shown in which the fingers 506a and 506b are joined in a bridge 1112 which is communicatively connected to the vacuum pad area 304 of the first end effector 302. Vacuum pads 1110a and 1110b are communicatively connected to the vacuum pad area 304 of the first end effector 302 via vacuum extension lines 1114 (shown in shadow). In this manner, the second end effector 502 may engage a substrate (not shown) using vacuum suction without requiring a third vacuum line.

It will be appreciated from the foregoing description that the present invention provides a method and apparatus for quickly and automatically changing from a first end effector for substrates of a first size to a mated configuration comprising a first end effector engaged with a second end effector. The robot recognizes that a particular end effector is required when the robot receives a signal that a particular size substrate requires processing or that processing is to take place in a particular mode, such as ultra clean environment mode. Various configurations are possible for signaling the robot, for example, the robot may be programmed to switch to or from a mated configuration. Alternatively, the variation in pod size used for the respective substrate sizes may trigger the robot to switch to or from a mated configuration, or the robot could be signaled via a manual switch.

In order to utilize the mated configuration, the robot needs only retrieve the second end effector from a nest and lift the second end effector to couple atop the first end effector and further engage the second end effector to the first end effector by means of a vacuum seal, electromagnet, or any other latch. Likewise, when it is desirable to use only a first end effector, the second end effector may be stored in the nest by reciprocal actions of the robot. Utilizing the embodiments of the present invention, an ultra clean semiconductor wafer positioning operation might take 5 seconds. Clean mode positioning might be faster, taking only 3 seconds. Clean mode allows use of the vacuum to seal the substrate onto the end effector so the robot can move faster without causing misalignment of the substrate. The robot will automatically select and mount the correct second large end effector for each batch of wafers. Furthermore, automated end effector change permits precise positioning operations to take place. For example, in the typical semiconductor wafer pod, wafers are narrowly spaced within the pod. The present invention permits precise handling operations to be performed on the narrowly spaced wafers.

Although the system and method of the present invention have been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A programmable substrate support for a substrate positioning system, comprising:
   a first substrate support that supports a first type of substrate and that mounts to a substrate positioning system to enable the substrate positioning system to handle substrates of the first type;
   a second substrate support that supports a second type of substrate and that is configured to mate with the first substrate support to form a mated configuration to enable the substrate positioning system to handle substrates of the second type; and a retention mechanism that uses a vacuum to secure the second substrate support to the first substrate support in the mated configuration.

2. The programmable substrate support of claim 1, further comprising:

the first and second substrate supports including complementary couplers that engage each other when the second substrate support is joined with the first substrate support to form the mated configuration.

3. The programmable substrate support of claim 2, wherein the complementary couplers include locating features that align the second substrate support with the first substrate support when joined.

4. The programmable substrate support of claim 3, wherein the locating features enable repeatable alignment between the first and second substrate supports when the first and second substrate supports are joined.

5. The programmable substrate support of claim 4, wherein the complementary couplers mate with zero insertion force.

6. The programmable substrate support of claim 2, wherein the complementary couplers comprise:

a positioning pin provided on the first substrate support; and a corresponding slot provided on the second substrate support, the slot including sides slanted towards a center to guide the positioning pin to the center when the first and second substrate supports are joined.

7. The programmable substrate support of claim 1, further comprising:

the first substrate support including a first vacuum pad area that engages a substrate of the first type positioned on the first substrate support to grip the substrate when a vacuum is applied.

8. The programmable substrate support of claim 1, further comprising:

the second substrate support including at least one vacuum pad that communicatively engages the first vacuum pad area in the mated configuration so that the vacuum pad engages a substrate of the second type positioned on the second substrate support to grip the substrate when vacuum is applied.

9. The programmable substrate support of claim 1, further comprising:

the second substrate support including at least one vacuum pad that communicatively engages a vacuum line in the mated configuration so that the vacuum pad engages a substrate of the second type positioned on the second substrate support to grip the substrate when vacuum is applied.

10. The programmable substrate support of claim 1, further comprising:

the first substrate support comprising a first end effector that supports a semiconductor wafer having a diameter of approximately 200 millimeters; and the second substrate support comprising a second end effector that supports a semiconductor wafer having a diameter of approximately 300 millimeters.

11. A substrate positioning system comprising:

a robot including a moveable arm;

a first substrate support that supports a first type of substrate, the first substrate support mounted to the moveable arm to enable the robot to handle substrates of the first type;

a second substrate support that supports a second type of substrate, the second substrate support configured to mate with the first substrate support to form a mated configuration to enable the robot to handle substrates of the second type; and a retention mechanism that uses a vacuum to secure the second substrate support to the first substrate support in the mated configuration.

12. The substrate positioning system of claim 11, further comprising:

the robot positioning the first substrate support below the second substrate support and then raising the first substrate support to join the first and second substrate supports together to form the mated configuration.

13. The substrate positioning system of claim 12, further comprising:

a nest for supporting the second substrate support, wherein the robot retrieves the second substrate support from the nest using the first substrate support.

14. The substrate positioning system of claim 12, further comprising:

the first and second substrate supports including complementary couplers that engage each other.

15. The substrate positioning system of claim 14, wherein the complementary couplers include locating features that align the second substrate support with the first substrate support when joined.

16. The substrate positioning system of claim 14, wherein the locating features enable repeatable alignment between the first and second substrate supports when the first and second substrate supports are joined.

17. The substrate positioning system of claim 16, wherein the complementary couplers join with zero insertion force.

* * * * *